United States Patent [19]

Valentine et al.

[11] Patent Number: 5,748,678

[45] Date of Patent: May 5, 1998

[54] RADIO COMMUNICATIONS APPARATUS

[75] Inventors: Stephen Thomas Valentine; Anthony John Wray, both of Basingstoke, United Kingdom

[73] Assignee: Motorola, Inc., Schaumburg, Ill.

[21] Appl. No.: 502,105

[22] Filed: Jul. 13, 1995

[51] Int. Cl.[6] .................................................. H03F 1/32
[52] U.S. Cl. ...................... 375/297; 375/296; 455/127; 330/149; 332/103; 332/162
[58] Field of Search ................................ 375/296, 297, 375/231, 284, 308; 455/127; 330/149; 332/103, 123, 159, 160, 162

[56] References Cited

U.S. PATENT DOCUMENTS

| | | | |
|---|---|---|---|
| 3,987,374 | 10/1976 | Jones, Jr. | 375/308 X |
| 4,890,300 | 12/1989 | Andrews | 375/297 |
| 5,014,285 | 5/1991 | Basile et al. | 375/303 |
| 5,179,360 | 1/1993 | Suzuki | 332/103 |
| 5,222,104 | 6/1993 | Medendorp | 375/297 X |
| 5,559,807 | 9/1996 | Van Den Heuvel et al. | 375/297 X |
| 5,590,418 | 12/1996 | Holoubek et al. | 375/297 X |
| 5,602,868 | 2/1997 | Wilson | 375/219 |

FOREIGN PATENT DOCUMENTS

| | | | |
|---|---|---|---|
| 2 265 269 | 9/1993 | United Kingdom | H03F 1/32 |
| 93/18602 | 9/1993 | WIPO | H04L 27/36 |

*Primary Examiner*—Young T. Tse
*Attorney, Agent, or Firm*—Wayne J. Egan

[57] ABSTRACT

A radio communications apparatus employs a training routine for optimizing performance and has a modulator (64, 66) to modulate a radio channel with digital information, to provide baseband signals (I, Q) at a first data rate. A power amplifier (36) amplifies signals fed from the modulator. A feedback loop (40, 42, 44, 30) samples the output signals of the power amplifier and adjusts at least one of the amplitude and phase of the baseband signals to compensate for distortion introduced by the power amplifier. The data rate of the baseband signals is reduced during the training routine to reduce adjacent channel transmissions.

6 Claims, 2 Drawing Sheets

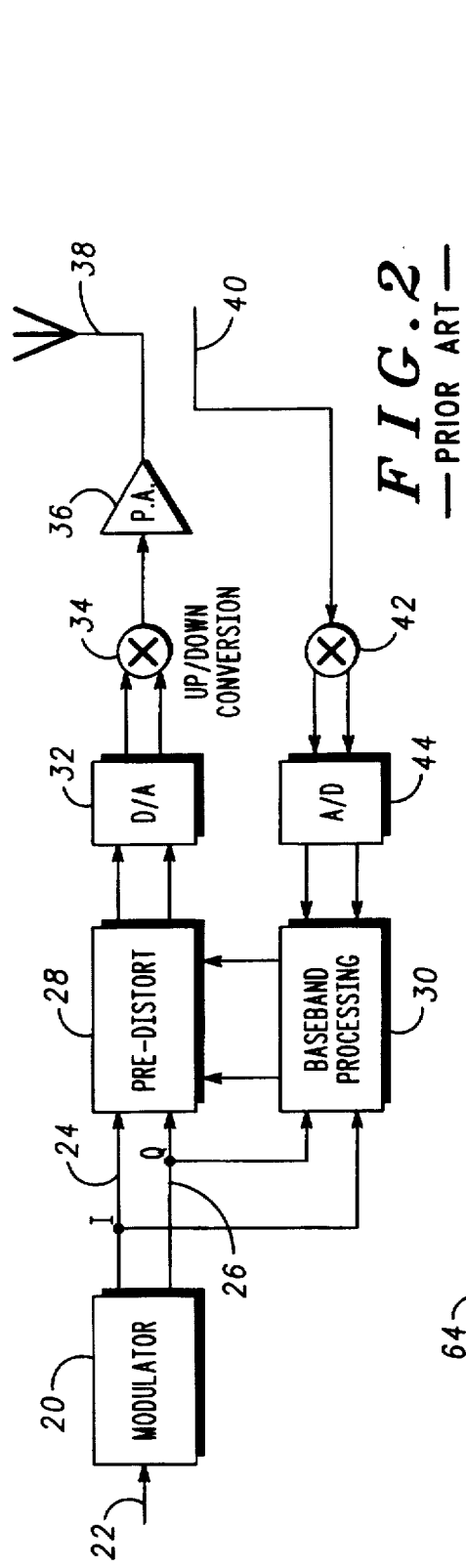
FIG. 2 — PRIOR ART —
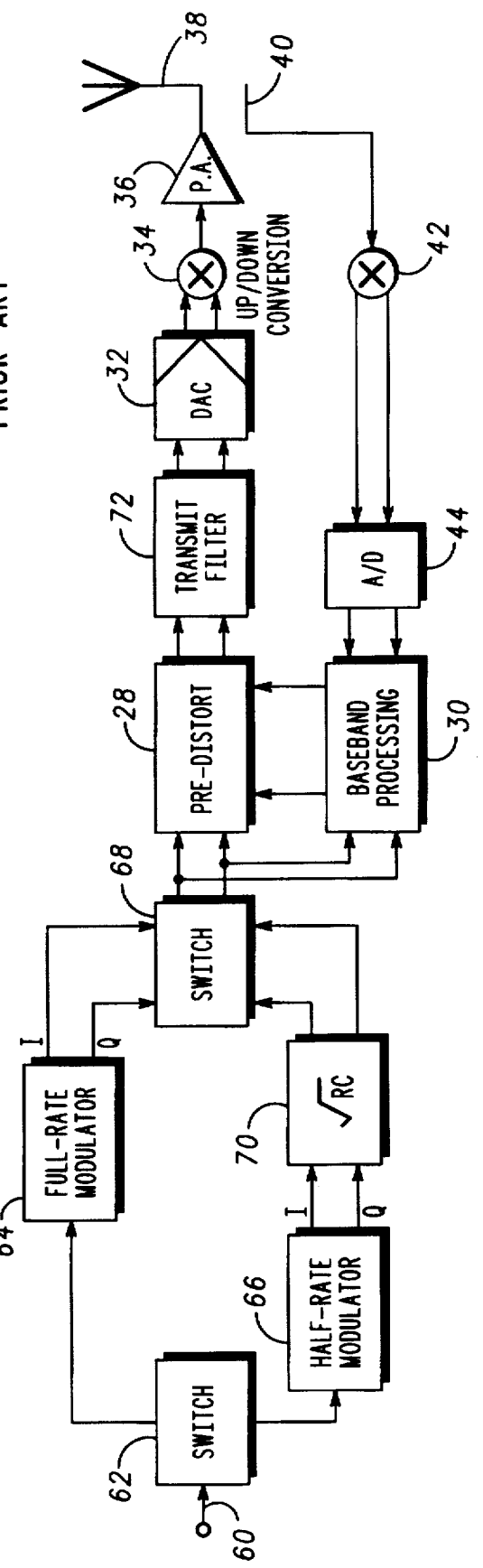
FIG. 4

RADIO COMMUNICATIONS APPARATUS

FIELD OF THE INVENTION

This invention relates to radio communication apparatus and in particular to digital apparatus.

BACKGROUND OF THE INVENTION

Digital radio standards require a number of radio channels to coexist together without one radio channel producing an unacceptable level of interference in an adjacent channel. This requirement dictates that each radio has a substantially linear spectrum. In other words the radio operates in a region of its power transfer characteristic which is linear.

Radios generally have a characteristic of output power various input power which is linear at low power levels, but which becomes non-linear as the output power exceeds a predetermined threshold.

If the radio is operated in a linear region of its characteristic then the output of the radio will have relatively low products in adjacent channels.

As the output power of the radio increases, so that it begins to operate in a non-linear region, the non-linearity generates intermodulation products, which appear in adjacent channels and are commonly known as adjacent channel splatter. The main intermodulation products creating interference in radio systems are 3rd order and to a lesser extent 5th order.

Current digital radio communications standards set stringent requirements for the level of adjacent channel intermodulation products, typically 60 dB below the level of the main signal in the channel.

One way of reducing the adjacent channel splatter would be to operate the radio at low power levels so that it remains within the linear region. This would however conflict with another important requirement of operating the radio efficiently to prolong battery life. To operate efficiently the radio needs to be run at higher power levels which encroach on the region of non-linearity.

In order to achieve both linearity and efficiency linearisation techniques must be employed.

In a digital radio, digital baseband signals are fed to a modulator in two phase quadrature channels known as Q and I. The output of the modulator is amplified in a power amplifier before being broadcast from the antenna.

Two systems of linearizing are commonly used, adaptive predistortion and cartesian feedback. Both linearisation systems employ a feedback loop which samples a portion of the output signals from the power amplifier and adjusts the amplitude and phase of the baseband input signals to compensate for distortion.

The predistortion and cartesian feedback systems are very similar to one another. In the predistortion system a training signal, generated by baseband digital circuitry is fed through the radio transmitter path where it is amplified, sampled, demodulated and fed back to a baseband processor.

From the fed-back signal the gain and phase distortion of the amplifier chain is fully characterised and stored in memory as a table of values. These values are then fed to a predistortion circuit, which distorts the baseband signals in a complementary way to compensate the distortion and produce a substantially linear transmitter characteristic.

In the cartesian feedback system the sampled, amplified signal has its phase adjusted to maintain a 180° phase shift between the output of the power amplifier and the baseband input signals. The fed-back signals are added to the baseband input signals to optimise the output power of the amplifier at a level which maintains linearity.

A problem arises in both systems during training periods when linearity is being obtained. The predistortion system is iterative and may take a number of iterations before converging on the final predistortion characteristic. During this relatively long period, typically of the order of 4 to 10 msecs, the radio will be non-linear and will produce unacceptable levels of adjacent channel splatter.

The cartesian feedback system is generally much quicker in achieving linearisation but nevertheless in order to achieve output power optimisation the radio needs to be ramped up to power outputs outside its linear operating region, once again leading to unacceptable levels of adjacent channel splatter.

This invention seeks to provide radio communications apparatus in which the above mentioned problems are mitigated.

SUMMARY OF THE INVENTION

According to the invention there is provided a radio communications apparatus employing a training routine for optimising performance, the apparatus including;

a modulator for modulating a radio channel with digital information, the modulator having an input for receiving digital data and providing first and second baseband signals at a first data rate; a power amplifier for amplifying output signals fed from the modulator; a feedback loop for sampling a portion of the output signals provided by the power amplifier and for adjusting the amplitude and phase of the baseband signals to compensate for distortion introduced by the power amplifier and means for reducing the data rate of the first and second baseband signals during the training routine to reduce adjacent channel interference.

Preferably the means for reducing the data rate of the first and second baseband signals comprises a second modulator operating at a second data rate lower then the first data rate, and having an output for selectably providing the first and second baseband signals during the training routine.

Filter means may be coupled to the output of the second modulator for further constraining the spectrum of the reduced rate signals.

Advantageously the filter means is an adaptive filter having a bandwidth which is adaptable in dependence upon the data rate of the second modulator.

The filter means is preferably a root raised cosine filter.

Preferably the means for reducing the data rate of the first and second baseband signals is operative to provide signals at one half of the first data rate.

BRIEF DESCRIPTION OF THE DRAWINGS

An exemplary embodiment of the invention will now be described with reference to the drawings in which;

FIG. 2 is a schematic block diagram of one known form of transmitter for use in the transceiver of FIG. 1;

FIG. 4 is a schematic block diagram of part of a radio communications apparatus in accordance with the invention;

DETAILED DESCRIPTION OF A PREFERRED EMBODIMENT

Figure 1:
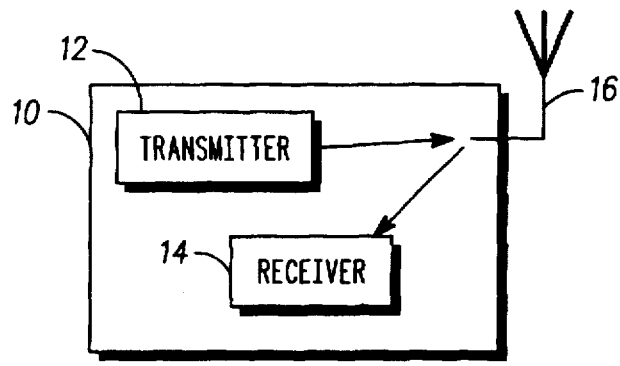
FIG. 1 shows a basic schematic block diagram of a known radio communications transceiver.

Referring to FIG. 1 a digital radio communications apparatus 10 comprises essentially a transmitter 12 and a receiver 14 which respectively provide signals to and receive signals from an antenna 16.

Continuing with respect to FIG. 2 the transmitter 12, which in this embodiment includes adaptive predistortion linearisation, comprises a modulator 20 having a data input 22 and outputs 24 and 26 supplying first and second baseband signals, generally known as I and Q.

In a typical digital radio standard the data input and the I and Q baseband signals have a data rate of 36 Kbits per sec.

The I and Q signals are fed in parallel to a pre-distortion circuit 28 and a baseband processor 30. As is well known the predistortion circuit 28 predistorts the baseband signals in a manner which is complementary to that introduced in the transmitter amplifier chain so that distortion is substantially cancelled and the radio meets the required level of adjacent channel performance.

The predistorted signal is fed via digital to analog converter 32 and up converter 34 to power amplifier 36 where it is amplified to the final output level for supplying to the antenna 38.

In order to characterise the amplifier chain to program the predistortion circuit, a portion of the output signal of the power amplifier 36 is sampled by a coupler 40 and fed via down converter 42 and analog to digital converter 44, to the baseband processor 30.

The baseband processor 30 compares the original (undistorted) I and Q signals with the fed back signals and derives information on the gain and phase changes introduced into the amplified signal in passing through the transmitter chain. From this information, which is stored in memory in the form of a table of values, digital processing in the baseband processor 30 applies a curve-fit routine to the predistortion circuit 28 to predistort the baseband signals as previously described.

As discussed, the transmitter must be trained by means of a training routine while a number iterations of predistortion are completed to achieve full linearisation performance. The training is accomplished by means of a training signal fed to the data input of the modulator.

During training the amplifier operates non-linearly and generates intermodulation products, which fall in adjacent channels and which may be outside the level set by digital radio standards specifications.

Figure 3:
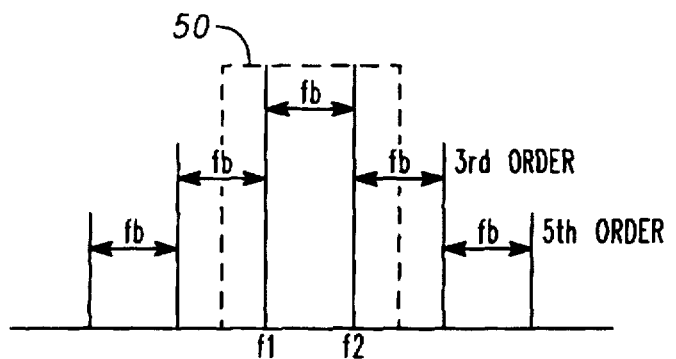
FIG. 3 is a spectral performance diagram for the transmitter of FIG. 2.

FIG. 3 shows the spectral performance of the transmitter of FIG. 2 during training. $f_1$ and $f_2$ are frequencies generated in the I and Q channels and separated by a frequency $f_b$. The dashed line 50 shows the boundaries of the bandwidth of the radio channel.

When the transmitter operates non-linearly during training intermodulation products are produced above and below the frequencies $f_1$ and $f_2$. In particular 3rd order products occur at a spacing of $f_b$ above $f_2$ and $f_b$ below $f_1$. 5th order products are spaced above and below the third order products by the same frequency step $f_b$.

The 3rd order products can be typically about 30 dB below the level of $f_1$ and $f_2$ and the 5th order products of the order of 60 dB below. As can be seen both the 3rd and 5th order products fall within adjacent channels.

Current standards for the level of such intermodulation products are very severe, typically −60 dB or more. A level of −30 dB in an adjacent channel would clearly not meet such a specification.

This problem is solved in by the present invention an embodiment of which will now be described with reference to FIG. 4 where like parts to those of FIG. 2 have like reference numbers.

Data is received at an input terminal 60 and coupled via a switch 62 either to a full rate modulator 64, operating at the normal full data rate of the radio transmission channel, typically 36 Kbits per sec, or to a reduced rate modulator 66 operating at typically half the full data rate of 18 Kbits per second. The full rate modulator is coupled to a further switch 68, to which is also coupled the half-rate modulator 66 via a root raised cosine filter 70.

The switch 68 operates in conjunction with the switch 60 to couple the output of the selected modulator to the predistortion circuit 28. The selected modem 64 or 66 is coupled via a switch 68 to the predistortion circuit 28 where it is processed in the transmitter chain, passing through a filter 72, to constrain the spectral spreading at the full rate bandwidth, digital to analog converter 32 and finally fed to the antenna and feedback loop as described with reference to FIG. 2.

The full rate modulator is employed during normal operation, after training, when full linearisation has been achieved, for transmitting normal channel traffic.

During training the reduced rate modulator is selected so that modulated signals are transmitted at reduced, and in this example half-rate.

Figure 5:
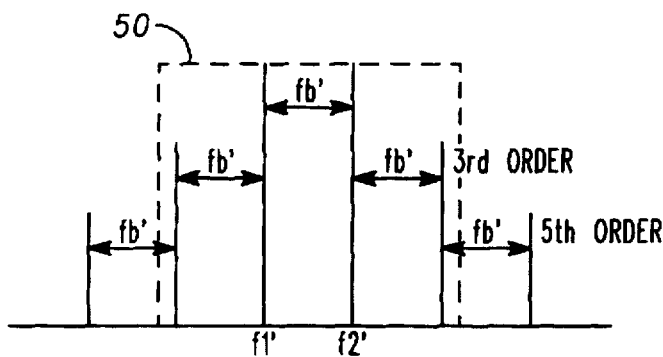
FIG. 5 is a spectral performance diagram for the apparatus of FIG. 4.

The advantages that using this reduced rate coding during training can be seen with reference to FIG. 5. At this reduced rate, the I and Q signals, now referenced f1' and f2' will be more closely spaced. The 3rd order and 5th order intermodulation products, generated during this 'non-linear' training period will also be spaced from f1' and f2' and from one another, by the reduced value fb'.

By optimising the reduced rate, the dominant 3rd order intermodulation products can be brought within the bandwidth limit 50 of the radio channel so that they no longer fall in an adjacent channel to cause interference.

The 5th order products still lie in an adjacent channel, but these will be below the −60 dB level and accordingly within specification.

Because the frequencies f1' and f2' are now closer together the additional filter 70 is incorporated to further limit spectral spreading and help match the reduced rate modulator 66 to the predistortion circuit 28, enabling useful signalling information to be transmitted during the training period.

Figure 6:
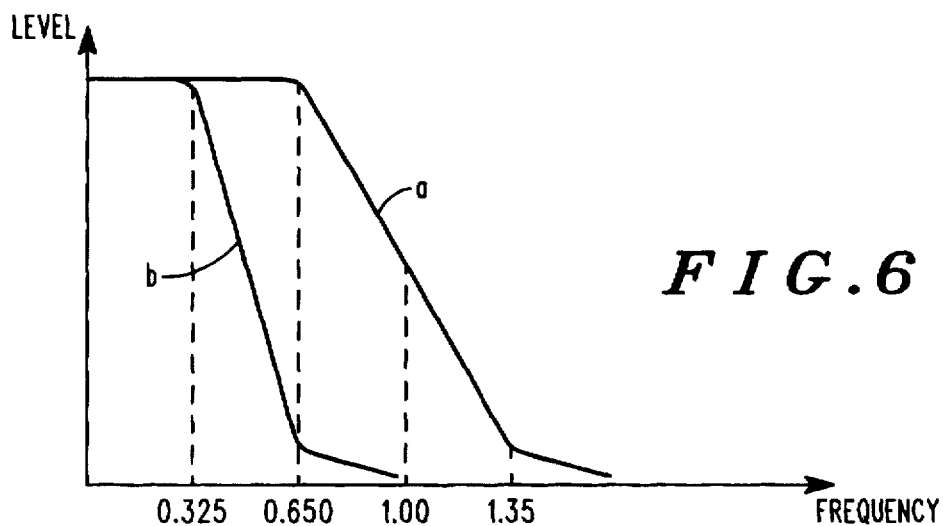
FIG. 6 illustrates the frequency response of the reduce rate spectrum constraining filter of the embodiment of FIG. 4.

The frequency responses of a full-rate transmit filter and the half-rate root raised cosine filter are shown in FIG. 6 by curves a and b respectively.

A further significant advantage of the invention is that it allows full training of the lineariser by using the inherent modulation scheme, rather than by means of a special training signal, while still conforming to limits for adjacent channel coupled power.

The benefit of this is that, although the data rate is reduced, all potential signal transmissions occur thus fully training the transmitter.

Because the normal modulation scheme is used, some necessary signalling data can be transmitted during the training period avoiding wasted transmission time.

Although the invention has been described by way of example with reference to using half-rate as the reduced coding rate, other reduced rates may be used to optimise the constraining of the intermodulation products. In this case the filter 70 coupled to the output of the reduced rate modulator can advantageously be adaptive to adjust its frequency to the optimised reduced rate.

The filter 70 need not necessarily be a root-raised cosine filter. This is merely preferred due to its ease of implementation.

The invention, although particularly described with reference to the adaptive predistortion system of linearisation is equally applicable to cartesian feedback in which the sampled output power is demodulated to recover quadrature cartesian components of the modulation. These signals are then used to provide negative feedback subtracting from the I and Q modulated signals to generate a loop error signal which is used to drive the modulator.

The lineariser may be trained by operating open loop to ascertain the phase shift of transmitted signals around the loop and correct to equal 180° for stable operation.

The reduced rate data is used during the period to provide loop phase information in open loop configuration. The loop is then closed and the remaining training period at reduced data rate is used to optimise the transmitter drive level to achieve maximum overall efficiency of the transmitter.

The invention claimed is:

1. Radio communications apparatus employing a training routine for optimising performance, the apparatus including;

a modulator for modulating a radio channel with digital information, the modulator having an input for receiving digital data and providing at least one baseband output signal at a first data rate;

a power amplifier for amplifying the at least one output signal fed from the modulator to provide at least one amplified output signal;

a feedback loop for sampling a portion of the at least one amplified output signal provided by the power amplifier and for adjusting at least one of the amplitude and phase of the at least one baseband signal to compensate for distortion introduced by the power amplifier; and means for reducing the data rate of the at least one baseband signal during the training routine to reduce adjacent channel transmissions.

2. The apparatus of claim 1 wherein the means for reducing the data rate of the at least one baseband signal comprises:

a second modulator operating at a second data rate lower than the first data rate; and a switching arrangement for selectably routing the input signal to the second modulator during the training routine.

3. The apparatus of claim 2 comprising filter means coupled to the output of the second modulator for further constraining the spectrum of the reduced rate signals.

4. The apparatus of claim 3 wherein the filter means is an adaptive filter having a bandwidth which is adaptable in dependence upon the data rate of the second modulator.

5. The apparatus of claim 3 wherein the filter means is a root raised cosine filter.

6. The apparatus of claim 1 wherein the means for reducing the data rate of the at least one baseband signal is operative to provide signals at substantially one half of the first data rate.

* * * * *